(12) United States Patent
Le Guillou et al.

(10) Patent No.: US 8,183,971 B2
(45) Date of Patent: May 22, 2012

(54) 8-SHAPED INDUCTOR

(75) Inventors: Yann Le Guillou, Caen (FR); Bassem Fahs, Caen (FR)

(73) Assignee: NXP B.V. (NL)

( * ) Notice: Subject to any disclaimer, the term of this patent is extended or adjusted under 35 U.S.C. 154(b) by 73 days.

(21) Appl. No.: 12/936,982

(22) PCT Filed: Apr. 2, 2009

(86) PCT No.: PCT/IB2009/051397
§ 371 (c)(1),
(2), (4) Date: Oct. 10, 2010

(87) PCT Pub. No.: WO2009/125324
PCT Pub. Date: Oct. 15, 2009

(65) Prior Publication Data
US 2011/0032067 A1    Feb. 10, 2011

(30) Foreign Application Priority Data

Apr. 10, 2008   (EP) .................................... 08290350

(51) Int. Cl.
*H01F 5/00* (2006.01)
*H01F 27/28* (2006.01)
(52) U.S. Cl. .......................... 336/200; 336/225; 336/226
(58) Field of Classification Search .................. 336/200, 336/225–226
See application file for complete search history.

(56) References Cited

U.S. PATENT DOCUMENTS 2,471,777 A * 5/1949 Reinartz ...................... 140/71 R
5,254,307 A * 10/1993 Hasegawa et al. ............... 420/66
6,577,219 B2 * 6/2003 Visser ........................... 336/200
6,867,677 B2 * 3/2005 Nielson ......................... 336/200

(Continued)

FOREIGN PATENT DOCUMENTS

WO    2004055839 A1    7/2004

(Continued)

OTHER PUBLICATIONS

International Search Report for Application PCT/IB2009/051397 (Apr. 2, 2009).

*Primary Examiner* — Anh Mai
(74) *Attorney, Agent, or Firm* — Kramer & Amado P.C.

(57) ABSTRACT

In a first aspect, the invention provides to a device comprising a substrate and an electrical conductor arranged between two terminals (A, B) and shaped for forming an inductor comprising at least two loops (1, 2) and arranged such that, at least locally, the far field is reduced. This arrangement results in an inductor which radiates a smaller magnetic field, also referred to as reduced EMI, which results in less noise generated in other inductive parts of an electronic circuit or system. The invention further provides in an advantageous embodiment proper balancing of the parasitic resistance and capacitance. By doing so the physical mid-point of 8-shaped inductors becomes the electrical mid-point (MP) which is beneficial when the inductor is used in a circuit. In a second aspect the invention provides an electronic system comprising the device according to the invention, wherein the electronic system comprises an LC-based voltage-controlled oscillator comprising the inductor, the electronic system being one of a group comprising: a multi-channel TV-receiver, a full-duplex transceiver, and a co-banding system. All these systems benefit from the symmetrical properties of the inductor. The better far-field compensation leads to a smaller VCO pulling effect which leads to a better performance of the system.

10 Claims, 8 Drawing Sheets

U.S. PATENT DOCUMENTS

| | | | |
|---|---|---|---|
| 6,972,658 B1 * | 12/2005 | Findley et al. | 336/200 |
| 7,372,352 B2 * | 5/2008 | Lee et al. | 336/200 |
| 7,420,451 B2 * | 9/2008 | Lee | 336/200 |
| 7,535,330 B2 * | 5/2009 | Erickson et al. | 336/200 |
| 2004/0075521 A1 | 4/2004 | Yu et al. | |
| 2004/0085175 A1 | 5/2004 | Lowther | |
| 2004/0108933 A1 | 6/2004 | Chen et al. | |
| 2004/0217839 A1 * | 11/2004 | Haaren et al. | 336/200 |
| 2005/0017836 A1 | 1/2005 | Maeda et al. | |
| 2005/0077992 A1 | 4/2005 | Raghavan et al. | |
| 2005/0151612 A1 | 7/2005 | Gau | |
| 2005/0195063 A1 | 9/2005 | Mattsson | |
| 2005/0237144 A1 | 10/2005 | Einzinger et al. | |
| 2006/0226943 A1 | 10/2006 | Marques | |

FOREIGN PATENT DOCUMENTS

| | | |
|---|---|---|
| WO | 2005096328 A1 | 10/2005 |
| WO | 2007080531 A1 | 7/2007 |

* cited by examiner

8-SHAPED INDUCTOR

FIELD OF THE INVENTION

The invention relates to a device comprising an inductor, and to an electronic system comprising such device.

BACKGROUND OF THE INVENTION

Over the recent years, the market has shown a trend of increasing adoption of TV applications to be included in PCs and set-top boxes, and this trend is not foreseen to stop. Today, devices exist that already include 2 TV receivers enabling to watch a TV program while recording another TV program. In the near future, TV receivers should at least be capable of simultaneously receiving four programs (e.g. in cable TV applications) and maybe even more.

With all those broadband TV receivers in a small form factor and on the same die, the issue of VCO pulling becomes increasingly important. With small(er) "form factor" is meant that the integration surface on silicon is getting smaller and smaller which makes interactions among sensitive blocks and EM sources (like VCOs) stronger. It has become a challenge to let multiple receivers operate at the same time without degrading the performance of the individual devices to a point where reception quality becomes unacceptable.

VCO pulling may already be observed today in systems with two TV receivers, in case a user desires to watch one TV channel and to record another TV channel. For example, a voltage-controlled oscillator (VCO1) in the first receiver is locked to incoming data of TV channel 1 at $f_{VCO1}$ and a voltage-controlled oscillator (VCO2) in the second receiver is locked to incoming data of TV channel 2 at a slightly different frequency $f_{VCO2}$. The two oscillators pull each other as a result of coupling through the substrate, the package, and the power supply (VCC/GND). As a consequence, the VCO1 output spectrum contains some sideband components at $f_{VCO1} +/- abs(f_{VCO1}-f_{VCO2})$ where abs(x) is the absolute value of x. Similarly, the VCO2 output spectrum contains some sideband components at $f_{VCO2} +/- abs(f_{VCO1}-f_{VCO2})$. These sidebands will also demodulate in the base-band some unwanted RF signal at frequency $f_{RF} +/- abs(f_{VCO1}-f_{VCO2})$ leading to an increase of noise. Therefore some sensitivity loss is most likely to be observed and the picture quality of the watched and/or recorded program may be deteriorated till an unacceptable level.

VCO pulling may also be observed in a 3G/CDMA2000 full-duplex transceiver when transmitting and receiving VCOs are operating simultaneously at different frequencies.

VCO pulling may also be observed in wireless voice-over-IP applications over WLAN, where the user desires to use a Bluetooth headset. As WLAN and Bluetooth operate on the same frequency band, the frequencies of the Bluetooth (BT) and WLAN VCOs may be very close. VCO pulling may be observed when, for example, the Bluetooth device B is transmitting a burst to the Bluetooth headset, and the WLAN device is receiving data at the same time.

The above described problems resulted in a need for reducing the coupling between the VCO's, in particular between inductors in these VCO's. In the prior art, the so-called integrated 8-shaped inductor (as part of a semiconductor device) is proposed as a solution. Such 8-shaped inductor exhibit a reduced strength of the radiated magnetic field (in the far field). The magnetic field generated by one of the loops is (in the far field) compensated by the magnetic field generated by the other loop.

A problem with the known 8-shaped inductor is that the residual far-field is still too large.

SUMMARY OF THE INVENTION

It is an object of the invention to provide a device comprising an inductor having a better far field reduction effect.

The invention is defined by the independent claims. The dependent claims define advantageous embodiments.

In a first aspect, the invention relates to a device comprising:
  a substrate;
  a first terminal and a second terminal;
  an electrical conductor arranged on the substrate between the first terminal and the second terminal to obtain an inductor and being shaped for forming a first loop and a second loop, wherein at least a first crossing of the electrical conductor with itself is present between the first loop and the second loop, the first loop and the second loop defining a first enclosed area and a second enclosed area, respectively, and wherein the first loop and the second loop are arranged for generating magnetic fields having substantially equal strength and opposite directions to obtain a reduction of a far field generated by the inductor, wherein the electrical conductor is provided with a second crossing with itself between the terminals and the second loop for further defining the boundary of the second enclosed area.

The effect of the features of the device according to the invention is that both loops are now better matched as far as their inductance is concerned. The first loop defines a first enclosed area which is bounded by the conductor and at least the first crossing. The second loop defines a second enclosed area which is bounded by the conductor, the first crossing and the second crossing. In other words, both loops now fully enclose a specific enclosed area, at least as far as their projection onto a surface, i.e. the substrate, is concerned. And, in an embodiment wherein both loops are provided with a similar shape and area the inductor has become more symmetrical which results in an even better matching of the inductance. In this embodiment, the inductance of the first loop is then better matched than the inductor of the second loop. It must be noted that in the 8-shaped inductor of the prior art solution the asymmetry in inductance between both loops needs to be compensated for by giving the first loop and second loop a different size and/or shape. The higher symmetry of the inductor (first loop and second loop) in the device of the invention provides for a better far-field compensation effect. With the crossings of the conductor with itself is meant that the conductor crossings are electrically insulated from each other.

In an embodiment of the device according to the invention the first and second enclosed areas have an equal area size. This leads to a higher symmetry of the conductor and thus a better matching of the inductances of the first and second loop, which on its turn leads to a better far-field compensation effect.

In an embodiment of the device according to the invention the first and second enclosed areas have a same shape. This leads to a higher symmetry of the conductor and thus a better matching of the inductances of the first and second loop, which on its turn leads to a better far-field compensation effect. In an embodiment of the device according to the invention the inductor is 8-shaped. Such a shape provides a good symmetry (and thus far-field compensation effect), i.e. the physical midpoint of the conductor path is located on the axis of symmetry of the 8-shape. Here that axis of symmetry is meant that divides both loops in equal halves. This type of 8-shape is also being referred to a single-turn 8-shape.

In an embodiment of the device according to the invention the electrical conductor is further shaped for forming a third loop and a fourth loop, wherein a least a third crossing of the electrical conductor with itself is present between the third loop and the fourth loop, the third loop and the fourth loop defining a third enclosed area and a fourth enclosed area, respectively, and the third loop and the fourth loop are arranged for generating magnetic fields having substantially equal strength and opposite directions to obtain, at least locally, a reduction of a far field generated by the inductor, wherein the conductor is further provided with a fourth crossing with itself connecting the first loop with the fourth loop thereby further defining the boundaries of the first enclosed area and the fourth enclosed area. In a first main variant of this embodiment all loops are arranged to obtain non-overlapping areas, the first loop being connected between the fourth loop and the second loop, the fourth loop being connected between the first loop and the third loop to obtain an 8-shaped structure in series with an 8-shaped structure. The advantage of this embodiment is that the effective inductance of the inductor is increased, while still maintaining the far-field compensation effect. In a second main variant of this embodiment the third loop is arranged within the first loop and the fourth loop is arranged within the second loop thereby forming a fifth crossing for further defining the fourth enclosed area, and forming a sixth crossing for further defining the first and second enclosed area, to obtain an 8-within-8 shaped structure. Next to the advantage of providing an inductor with a higher effective inductance, a main additional advantage of this embodiment is that the area is kept smaller. This type of 8-shape is also being referred to a double-turn 8-shape.

In an embodiment of the device according to the invention at least a first interconnect layer formed on the substrate and a second interconnect layer arranged to cooperate with the first interconnect layer, and the electrical conductor comprises a main part laid out in the second interconnect layer, and the first crossing and second crossing each comprise a further part laid out in the first interconnect layer, the further part crossing the main part, the further part being connected to the main part by means of contacts or vias to obtain the first and second crossing of the electrical conductor wherein crossing conductor parts are electrically insulated with respect to each other by a dielectric layer in between the main part and the further part. Such a device provides a convenient implementation of an on-chip inductor making use of interconnect layers that were already present.

In an embodiment of the device according to the invention the first crossing and the second crossing are constructed such that one is an pass-over structure and the other is an pass-under structure considered on a path along the conductor between the first terminal and a mid-point, the mid-point being defined on the conductor at a distance matching half the length of the conductor between the terminals. In an alternative embodiment of the device according to the invention the crossings are constructed such that the number of pass-over structures equals the number of pass-under structures considered on a path along the conductor between the first terminal and a mid-point, the mid-point being defined on the conductor at a distance matching half the length of the conductor between the terminals. The advantage of both embodiments is that both paths from terminal to mid-point are better matched in terms of parasitic resistance and capacitance. In semiconductor technology interconnect layers generally do not have the same sheet resistance and parasitic capacitance. For example, the upper interconnect layer normally has the lowest resistance, because the wires are designed thicker and wider. Also this layer generally has a lower parasitic capacitance to the substrate because of the larger distance to the substrate. It is preferred to manufacture the inductor in the upper interconnect layer, because of its lower sheet resistance. In that case, only at a crossing of the conductor with itself, part of lower interconnect layer needs to be used, i.e. at least two vias and a piece of interconnect in the lower layer are needed. This piece of the lower interconnect layer generally has a higher resistance and a higher parasitic capacitance, because its distance to the substrate is smaller. In other words, the crossing introduces an additional resistance and capacitance in the path that runs below the other. Thus, making the number of over-passes and under-passes equal for both paths (from terminal to mid-point) makes the paths electrically equal, i.e. RC matched. Expressed, differently, physical mid-point on the conductor becomes the electrical mid-point, i.e. the inductor also becomes symmetrical electrically. It is worth noting that the inventors discovered that when non-symmetrical inductors are used, the performance of the electronic circuit in which the inductor is used, is adversely affected:

1. In case of an inductor as a part of a resonating tank in a VCO, the asymmetry has a degrading effect on the global phase noise performance;
2. In case of an inductor as a load or a degeneration source of a differential amplifier, the asymmetry generates some even harmonic distortion. As a result, the amplifier's signal-to-noise and distortion ratios will be degraded.
3. In case of an inductor in an LC differential filter, the asymmetry will introduce some undesired gain and phase imbalance.

The device comprising the inductor according to the invention may be used in any type of differential structure. When used in LC differential filters, the symmetrical inductor helps to minimize amplitude and phase imbalance. When used in any non-linear and differential stage (amplifier, mixer, etc.) the symmetrical inductor ensures better differential characteristics and higher even-harmonics rejection. This advantage can be well understood by the person skilled in the art, since in any differential structure, a DC or AC offset will disturb the symmetry and degrade the differential performance. The same holds for the even-harmonics generation.

In an embodiment of the device the inductor is part of an electronic circuit selected from a group comprising: an RF filter, a LC-based voltage-controlled oscillator, an LC-based differential amplifier, a mixer, a Tx amplifier, and a load driver. Any such electronic circuit benefits from the better symmetry of the inductor. In any case, the far-field of the inductor is further reduced more because of the balanced inductance of the loops which reduces disturbance (reduced EMI) on other parts of the electronic circuit, on other electronic circuits in the same system, or on parts in other systems in the vicinity.

In an embodiment of the device the substrate is a semiconductor substrate to obtain a semiconductor device. A semiconductor device features easy integration of passive elements like the inductor in accordance with the invention.

In a second aspect the invention relates to an electronic system comprising such device, wherein the electronic system comprises an LC-based voltage-controlled oscillator comprising the inductor, the electronic system being one of a group comprising: a multi-channel TV-receiver, a full-duplex transceiver, and a co-banding system. In such a system, the earlier mentioned reduced EMI of the inductor also leads to reduced oscillator pulling, which is a known problem in systems having multiple receivers/transceivers (each having an inductor in the VCO) operating at the same time. Reduced oscillator pulling causes less sideband components to occur and thus less sensitivity loss and a higher picture quality (i.e. in a TV system).

These and other aspects of the invention are apparent from and will be elucidated with reference to the embodiments described hereinafter.

BRIEF DESCRIPTION OF THE DRAWINGS

In the drawings:

FIG. 5 shows a layout view of the 8-shaped inductor of FIG. 3a;

DETAILED DESCRIPTION OF THE EMBODIMENTS

The invention aims at providing a semiconductor device comprising an inductor having improved far-field compensation. Improved far-field compensation implies a reduction of the strength of the radiated magnetic field. This results in a better electrical performance in case the inductor according to the invention is used in an electronic circuit, for example a voltage-controlled oscillator. Reduced radiated magnetic field in general means also reduced coupling noise in other parts of the electronic circuit, which leads to a better electrical performance as has been mentioned earlier in this description.

Throughout this description the term "interconnect layer" should be considered as synonym to "metallization layer". Both terms are used interchangeably and have to be interpreted as the layer comprising conductors, the insulating layer in which the conductors are embedded, and any vias (=contacts) to underlying layers. These terms are well-known to the person skilled in the art of semiconductor technology.

Figure 1:
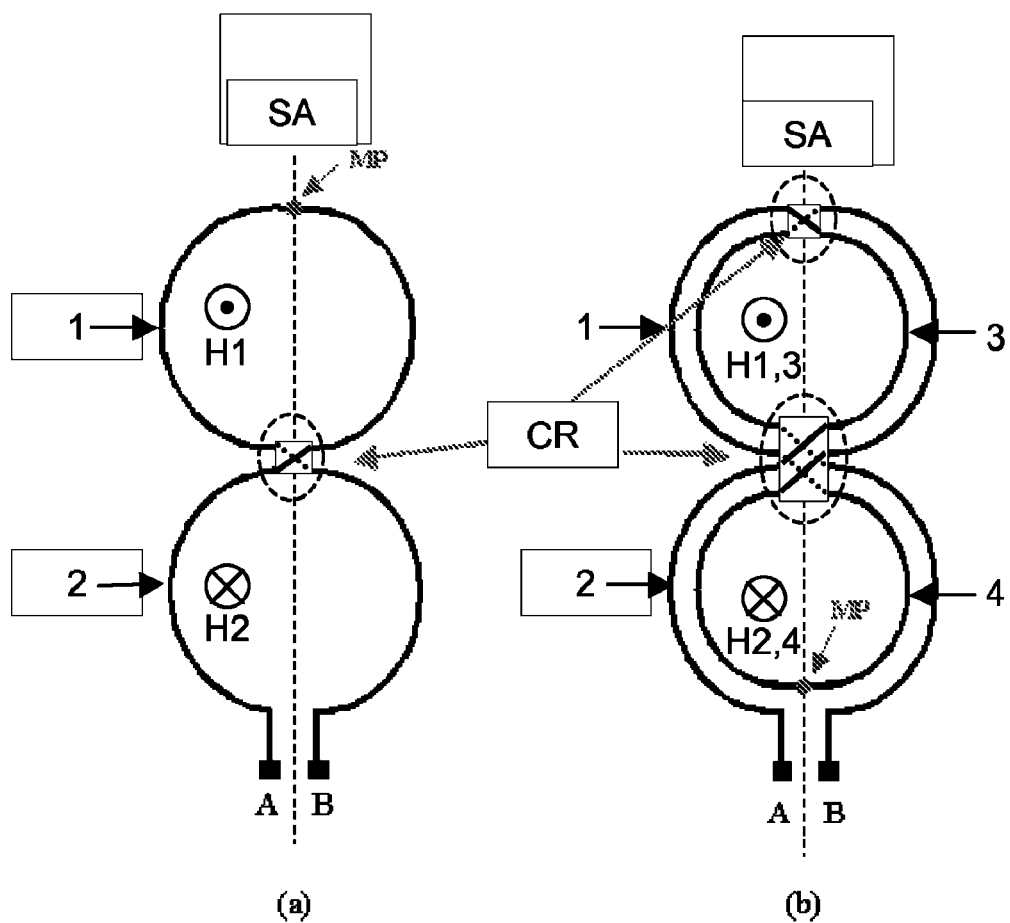
FIG. 1a shows a single-turn 8-shaped inductor as known from the prior art.
FIG. 1b shows a double-turn 8-shaped inductor as known from the prior art.

FIG. 1a shows a single-turn 8-shaped inductor as known from the prior art. The inductor is formed by means of an electrical conductor arranged between two terminals A, B and shaped for forming a first loop 1 and a second loop 2, wherein a crossing CR is present between the first loop 1 and the second loop 2. The first loop 1 encloses a first area and the second loop 2 encloses a second area. The arrangement of the loops 1, 2 is such that when a current is fed through the electrical inductor magnetic fields H1, H2 are generated by the loops which were thought to have substantially equal strength and opposite directions, and in the far field these magnetic fields compensate each other which reduces the far field strength at least locally. The amount of far field compensation depends upon, amongst other parameters, the shape and orientation of the first loop 1 and the second loop 2, but also upon the areas of the enclosed areas of the first loop and the second loop 2. The first loop 1 is defined by the electrical conductor and the crossing CR, which makes the first enclosed area, at least in projection in a direction perpendicular to the plane in which the first loop is arranged, fully enclosed. The second loop 2 is defined by the electrical conductor and the crossing CR.

Despite the fact that both enclosed areas have substantially the same area and are symmetrical with respect to an axis of symmetry SA, an asymmetry of the inductor is present on the side of the terminals A, B. This asymmetry is caused by the fact that the second enclosed area is not fully enclosed. In order to improve the far-field compensation effect it is possible to make the second loop 2 a bit larger than the first loop 1.

FIG. 1b shows a double-turn 8-shaped inductor as known from the prior art. Such a double-turn 8-shaped inductor provides for a larger inductance value than a single-turn 8-shaped inductor when the areas of the first and second loop are kept constant. The inductor is also formed by means of an electrical conductor arranged between two terminals A, B and shaped for further forming a third loop 3 and a fourth loop 4, wherein the third loop 3 is arranged within the first loop 1 and the fourth loop 4 is arranged within the second loop. Such a shaping of the electrical conductor results in a number of crossings CR as is illustrated in FIG. 1b; in this example five crossings are formed of which four in the middle section of the inductor. Similar to FIG. 1a, the first loop 1 encloses a first area and the second loop 2 encloses a second area. Also, the third loop 3 encloses a third area and the fourth loop 4 encloses a fourth area. The arrangement of the loops 1, 2, 3, 4 is such that when a current is fed through the electrical inductor magnetic fields H1, H2 generated by the first and second loops 1, 2 have substantially equal strength, and magnetic fields H3, H4 generated by the third and fourth loops 3, 4 have substantially equal strength. The direction of the magnetic field H1 generated by the first loop 1 is the same as that H3 of the third loop 3. The direction of the magnetic field H2 generated by the second loop is the same as that H4 of the fourth loop 4. Similar to the inductor of FIG. 1a at least locally in the far field these magnetic fields compensate each other which reduces the far field strength.

The third loop 3 is defined by the electrical conductor, the crossing CR at the top part of the drawing, and one (the upper one in the drawing) of the four crossings CR in the middle section of the drawing. The fourth loop 4 is defined by the electrical conductor and one (the lower one in the drawing) of the four crossings CR in the middle section of the drawing. This makes both the enclosed areas of the third loop 3 and the fourth loop 4, at least in projection in a direction perpendicular to the plane in which the loops are arranged, fully enclosed and with substantially the same area.

The first loop 1 is defined by the electrical conductor, the crossing CR at the top part of the drawing, the three of the four crossings CR in the middle section (the upper three) of the drawing, which makes the first enclosed area, at least in projection in a direction perpendicular to the plane in which the first loop is arranged, fully enclosed. The second loop 2 is defined by the electrical conductor and three of the four crossings CR (the lower three) in the middle section of the drawing.

Despite the fact that the enclosed areas of the first and second loops 1, 2 have substantially the same area and are symmetrical with respect to an axis of symmetry SA, an asymmetry of the inductor is present on the side of the terminals A, B. This asymmetry is caused by the fact that the second enclosed area is not fully enclosed. In order to improve the far-field compensation effect it is possible to make the second loop 2 a bit larger than the first loop 1.

Figure 2:
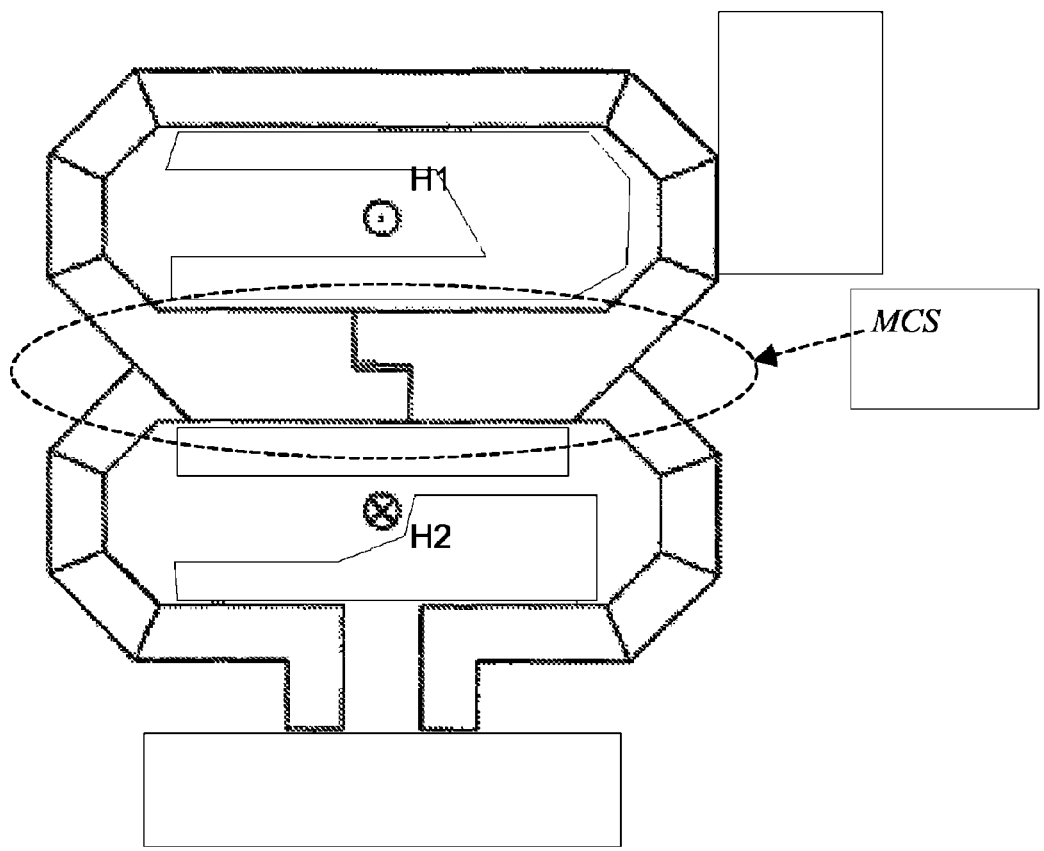
FIG. 2 shows another 8-shaped inductor layout as known from the prior art.

FIG. 2 shows another 8-shaped inductor layout as known from the prior art. The loops are clearly identifiable and also the magnetic field directions H1, H2 are schematically illustrated in FIG. 2. This inductor comprises a middle crossing section MCS having extended or enlarged portions of metal in order to achieve symmetry, and to balance the cross-point's equivalent resistive and capacitive elements. The aim for this designing this inductor was to achieve the symmetry with one single cross-point for a single-turn 8-shaped inductor, which single cross-point is placed in the middle of the device. The design is such that both halves of the crosspoint have the same parasitic capacitances (to substrate and to upper layer) and resistances, which provides electrical symmetry. The 8-shaped inductor of FIG. 2 has been reported in WO2005/096328. It provides a symmetrical layout and a solution to build a system having LC-based VCO's with mitigated VCO pulling effect by reducing the strength of the radiated magnetic field of the VCO's.

However, there is a clear drawback in the inductor of FIG. 2, namely that the extended or enlarged portions of metal will result in an increase of the mutual parasitic capacitance among the inductor's wires, and also the capacitance to substrate. A consequence of this is that the self-resonating frequency of the inductor shifts to lower frequencies, which limits the range of inductance value, the quality factor and/or the operation frequency. This will be elaborated on in the description of FIGS. 6 and 7.

Figure 3:
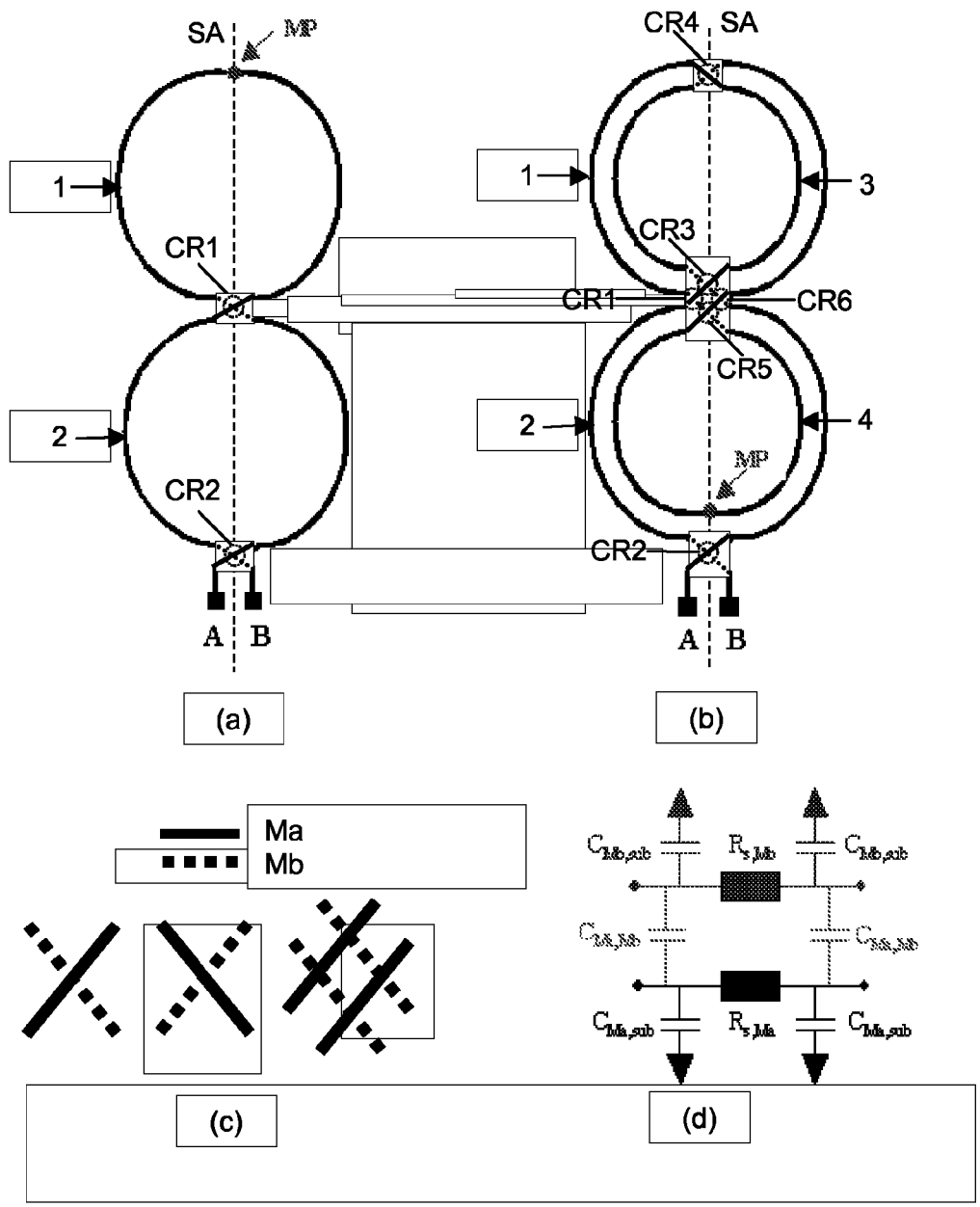
FIG. 3a shows an 8-shaped inductor in accordance with an embodiment of the invention.
FIG. 3b shows an 8-shaped inductor in accordance with an embodiment of the invention.
FIG. 3c shows a schematical zoom view of the crossings of FIGS. 3a and 3b.
FIG. 3d shows an equivalent parasitic modeling at the crossing of FIG. 3c, in case the crossing is implemented on a semiconductor device.

FIG. 3a shows an 8-shaped inductor in accordance with an embodiment of the invention. This embodiment will be mainly discussed in as far as it differs from FIG. 1a. FIG. 3b shows an 8-shaped inductor in accordance with an embodiment of the invention. This embodiment will be discussed in as far as it differs from FIG. 1b. In the single-turn 8-shaped inductor of FIG. 3a a first crossing CR1 is situated between the first loop 1 and the second loop 2. In the double-turn 8-shaped inductor of FIG. 3b there are, similar to FIG. 1b, four crossings CR1, CR3, CR5, CR6 in the middle part of the drawing. In both embodiments the second loop 2 is further defined by a second crossing CR2 in between the second loop 2 and the terminals. Expressed differently, the area that is, at least in projection in a direction perpendicular to the plane in which the loops are arranged, enclosed by the second loop 2 is now also defined by the second crossing CR2. Consequently, the inductors of FIGS. 3a and 3b are more symmetrical concerning the first loop 1 and the second loop 2 which leads to a stronger far-field compensation effect (reduced radiated magnetic field) in case the loops have a similar shape and similar area.

FIG. 3c shows a schematical zoom view of the crossings of FIGS. 3a and 3b. The crossing on the left in FIG. 3c is a zoom view of the first crossing CR1 and the second crossing in FIG. 3a and the second crossing in FIG. 3b. The crossing in the middle is a zoom view of the fourth crossing CR4 in FIG. 3b. The crossing on the right is a zoom view of the ensemble of the first, third, fifth and sixth crossing CR1, CR3, CR5, CR6 in FIG. 3b. When following the electrical conductor from one terminal to the other crossings may be designed as a pass-over structure or a pass-under structure. It falls within the design freedom of the designer to choose between such structures for every crossing. However, in an embodiment of the invention, special attention has been given to this in order to achieve an advantageous effect. This will be elucidated herein after with reference to FIGS. 3a, 3b, and 3d.

FIG. 3d shows an equivalent parasitic modeling at the crossing of FIG. 3c, for the situation where the inductor is implemented in a semiconductor device. As already described earlier in this description, the traditional non-symmetrical "8-shaped" inductors of FIGS. 1a and 1b may introduce an asymmetry in the inductance of the first loop 1 and the second loop. However, when implemented on a semiconductor device also an asymmetry in the resistance and capacitance may be introduced. This is explained as follows.

An inductor of the kind of FIGS. 3a and 3b may be implemented on a semiconductor device comprising a substrate having at least two interconnect layers Ma, Mb integrated into it. Generally, the top interconnect layer Ma has the lowest resistance (i.e. a thicker wire) and the lowest capacitance (i.e. the largest distance to the substrate). Because of this aspect the electrical conductor is generally substantially laid out in the top interconnect layer Ma, except for the locations where the electrical conductor crosses itself (in an electrically insulating manner). At those crossings the lower interconnect layer Mb must be used. That part of the electrical conductor laid out in the lower interconnect layer Mb most likely has a higher sheet resistance and also a higher capacitance to substrate, but in any case these parasitic quantities are different for both interconnect layers Ma, Mb, expressed in the expressions:

$$C_{Ma,sub} \neq C_{Mb,sub} \text{ and } R_{s,Ma} \neq R_{s,Mb}.$$

As a consequence of this difference in parasitic values the middle-point MP, which is defined as the geometrical middle-length point of the device, is not the "electrical" middle-point. This may be understood when considering FIG. 4, which shows an equivalent electrical model of the inductor of FIG. 3. The path from terminal A to midpoint MP has a capacitance $C_{A\text{-}MP}$, an inductance $L_A$, and a resistance $R_{A\text{-}MP}$. Similarly, the path from terminal B to midpoint MP has a capacitance $C_{B\text{-}MP}$, an inductance $L_B$, and a resistance $R_{B\text{-}MP}$. The equivalent resistive and capacitive components are not equal between each inductor's terminal A, B and the middle-point MP (the inductive component may be equal because there are defined by the shape and area of the loops):

$$R_{A\text{-}MP} \neq R_{B\text{-}MP} \text{ \& } C_{A\text{-}MP} \neq C_{B\text{-}MP}.$$

It is worth noting that when non-symmetrical inductors are used, the performance of the electronic circuit in which the inductor is used, is adversely affected:
1. In case of an inductor as a part of a resonating tank in a VCO, the asymmetry has a degrading effect on the global phase noise performance;
2. In case of an inductor as a load or a degeneration source of a differential amplifier, the asymmetry generates some even harmonic distortion. As a result, the amplifier's signal-to-noise and distortion ratios will be degraded.

3. In case of an inductor in an LC differential filter, the asymmetry will introduce some undesired gain and phase imbalance.

An advantageous embodiment is obtained if the number of pass-over structures and pass-under structure from each of the terminals A,B to the mid-point MP is the same. Any asymmetry caused by a crossing in one path is then compensated for by another crossing in the other path. Referring to FIG. 3a. When going from terminal A to the mid-point MP first a pass-over structure is seen, namely the second crossing CR2, and then a pass-under structure is seen, namely the first crossing CR1. When going from terminal B to the mid-point MP first a pass-under structure is seen, namely the second crossing CR2, and then a pass-over structure is seen, namely the first crossing CR1. In other words, both paths have one pass-over structure and one pass-under structure, which balances the resistance and the capacitance in both paths.

Similarly for FIG. 3b, the structure sequence from terminal A to mid-point MP may be derived: over (CR2), under (CR6), under (CR3), under (CR4), over (CR6), over (CR5)→3:3. And from terminal B to mid-point MP: under (CR2), over (CR1), over (CR3), over (CR4), under (CR1), under (CR5)→3:3.

Figure 5:
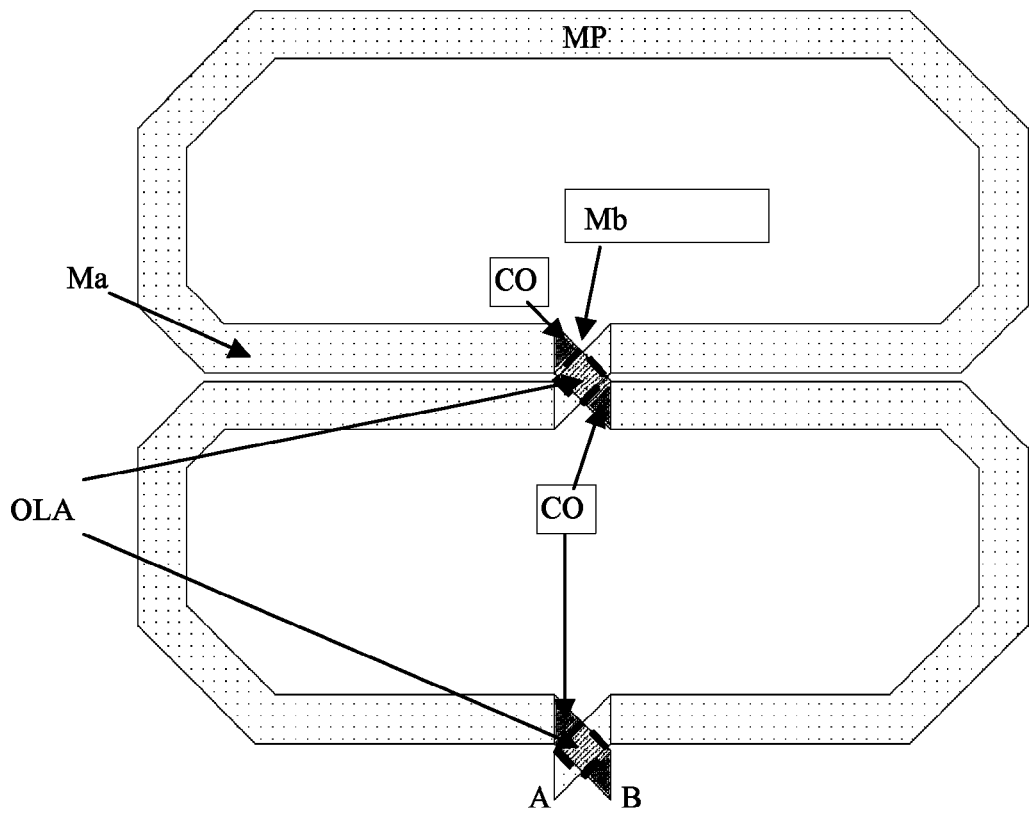

FIG. 5 shows a layout view of the 8-shaped inductor of FIG. 3a. The inductor has been implemented in a device comprising a substrate having at least two interconnect layers, a top interconnect layer Ma, and a lower interconnect layer Mb. The substrate may be a semiconductor substrate thus obtaining a semiconductor device. Semiconductor technology and any other integration technology (i.e. CMOS technology, BiCMOS technology, Bipolar technology, PCB technology, etc.) is well known the person skilled in the art. It is not mandatory to use an adjacent interconnect layer for the crossings, however, while doing so the number of vias/contacts for making the crossing is minimized which is keeps the additional resistance and capacitance caused by the crossing minimum. As already mentioned earlier the inductor is preferably implemented in the top interconnect layer due to its lowest sheet resistance (wires are thicker) and lowest capacitance to substrate. In FIG. 5 a main part of the 8-shaped inductor is implemented in the top interconnect layer Ma. At the crossings one of the conductive paths is fully laid out in the top interconnect layer Ma, while the other uses part of the lower interconnect layer Mb. The connection between both interconnect layers is made by means of contact areas CO. The following aspects must be noted. First of all, at the crossings the overlapping areas OLA are very small, which keeps the mutual capacitance low. This is in clear contrast with the inductor of FIG. 2, where the mutual capacitance is quite large, having a negative impact on the electrical performance of the circuit in which the inductor is used. Second, both the conductive path from terminal A to the midpoint MP and the path from terminal B to the midpoint MP have one pass-over structure and one pass-under structure. Together with the fact that both crossings are designed identically this implies that both paths have the same parasitic resistance and capacitance, which is beneficial for the performance of the circuit in which the inductor is used.

The description of FIG. 5 is fully based upon a semiconductor device situation. Nevertheless, the substrate does not necessarily need to be a semiconductor substrate. Any type substrate having at least two interconnect layers provided thereon may be used.

Figure 4:
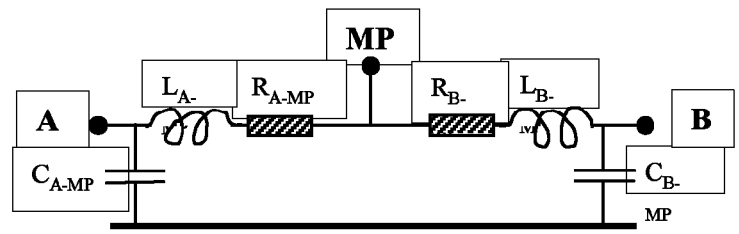
FIG. 4 shows an equivalent electrical model of the inductor of FIG. 3.
Figure 6:
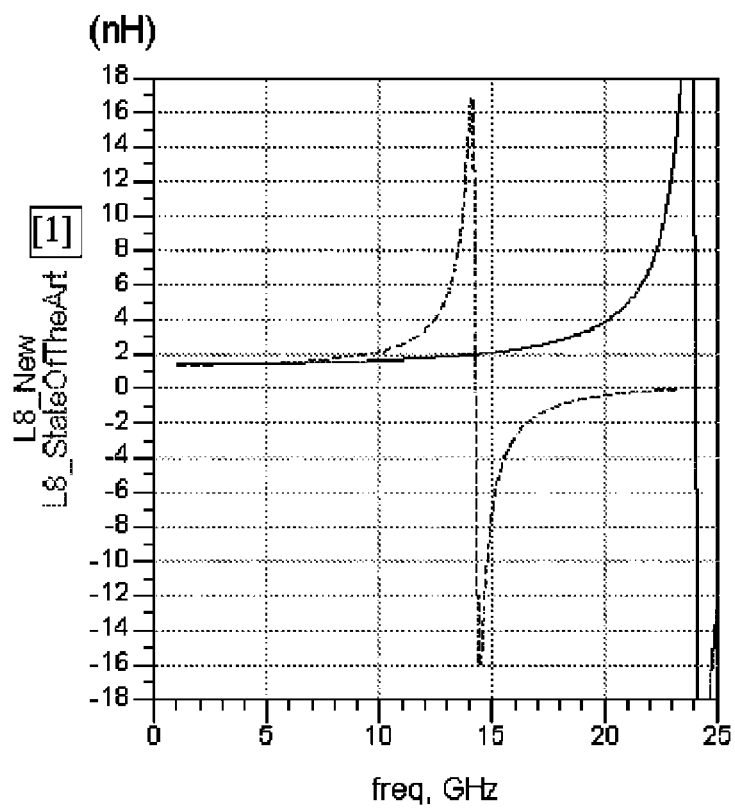
FIG. 6 shows a comparison of the simulated inductance value versus frequency of the inductor of FIG. 4 with the inductor of FIG. 2.

FIG. 6 shows a comparison of the simulated inductance value versus frequency of the inductor of FIG. 4 with the inductor of FIG. 2 (as proposed in WO2005/096328). In the description of FIG. 2 it was already mentioned that a large mutual capacitance at the crossings of the inductor results in a down-shift of the self-resonating frequency of the inductor shifts to lower frequencies. FIG. 6 shows the simulated inductor values versus frequency of the inductor of FIG. 2 (dashed line), and of the inductor in accordance with the invention (solid line). Although, both inductances have almost the same values at low frequency (~1.4 nH), they behave differently at higher frequencies. The resonance frequency of the inductor of FIG. 2 lies around 14 GHz, and the resonance frequency of the inductor in accordance with the invention lies around 24 GHz.

Figure 7:
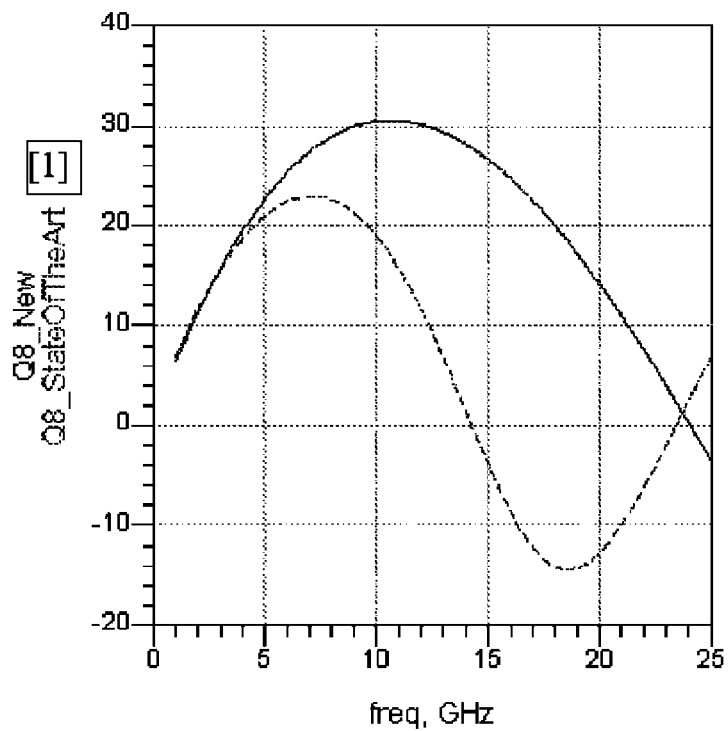
FIG. 7 shows a comparison of the simulated quality factor versus frequency of the inductor of FIG. 4 with the inductor of FIG. 2.

FIG. 7 shows a comparison of the simulated quality factor versus frequency of the inductor of FIG. 4 with the inductor of FIG. 2 (as proposed in WO2005/096328). FIG. 7 shows the simulated quality factors versus frequency of the inductor of FIG. 2 (dashed line), and of the inductor in accordance with the invention (solid line). The curves show a substantially equal Q-factor at lower frequencies, but the maximum Q-factor for the inductor in accordance with the invention is significantly larger for the frequency range from about 5 GHz to 23 GHz.

Figure 8:
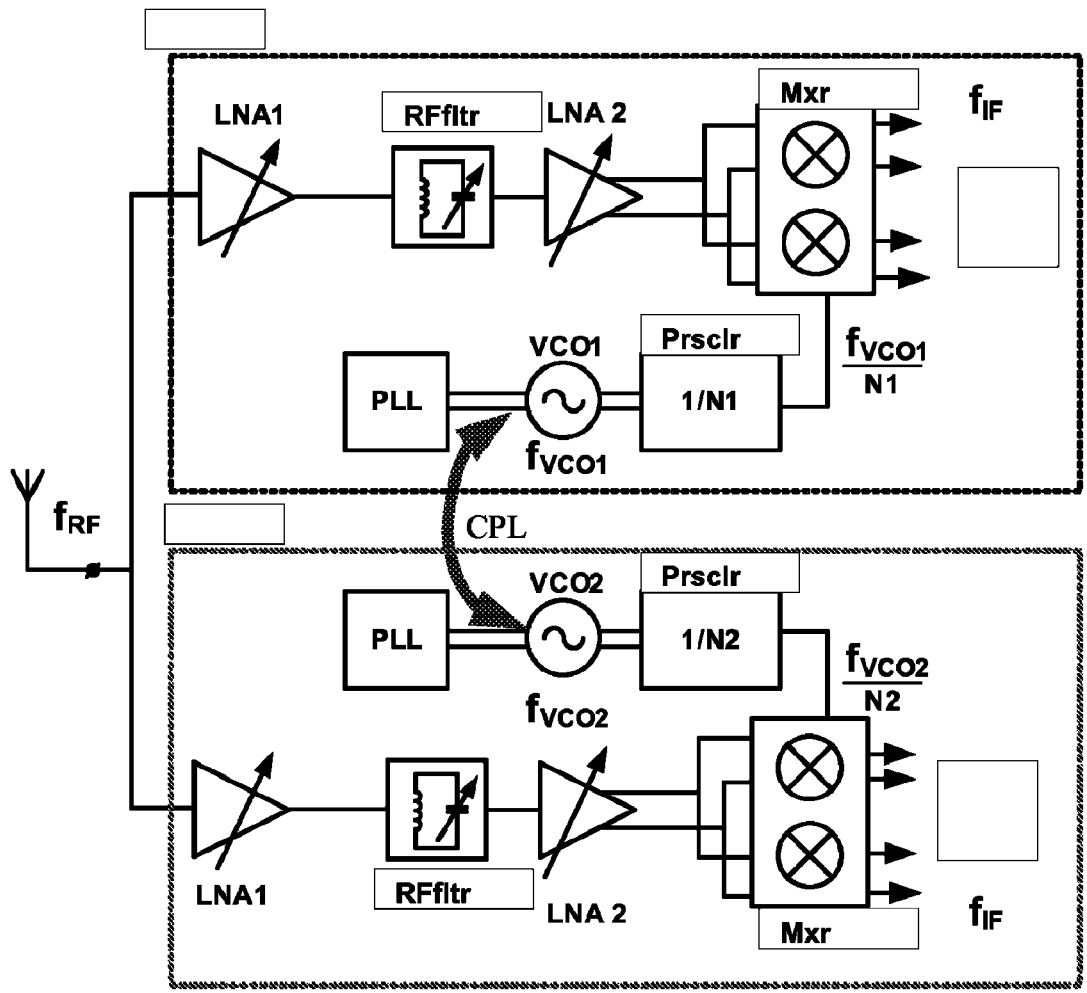
FIG. 8 illustrates a broadband multi-channel TV receiver system that may benefit from the semiconductor device in accordance with the invention.
Figure 9:
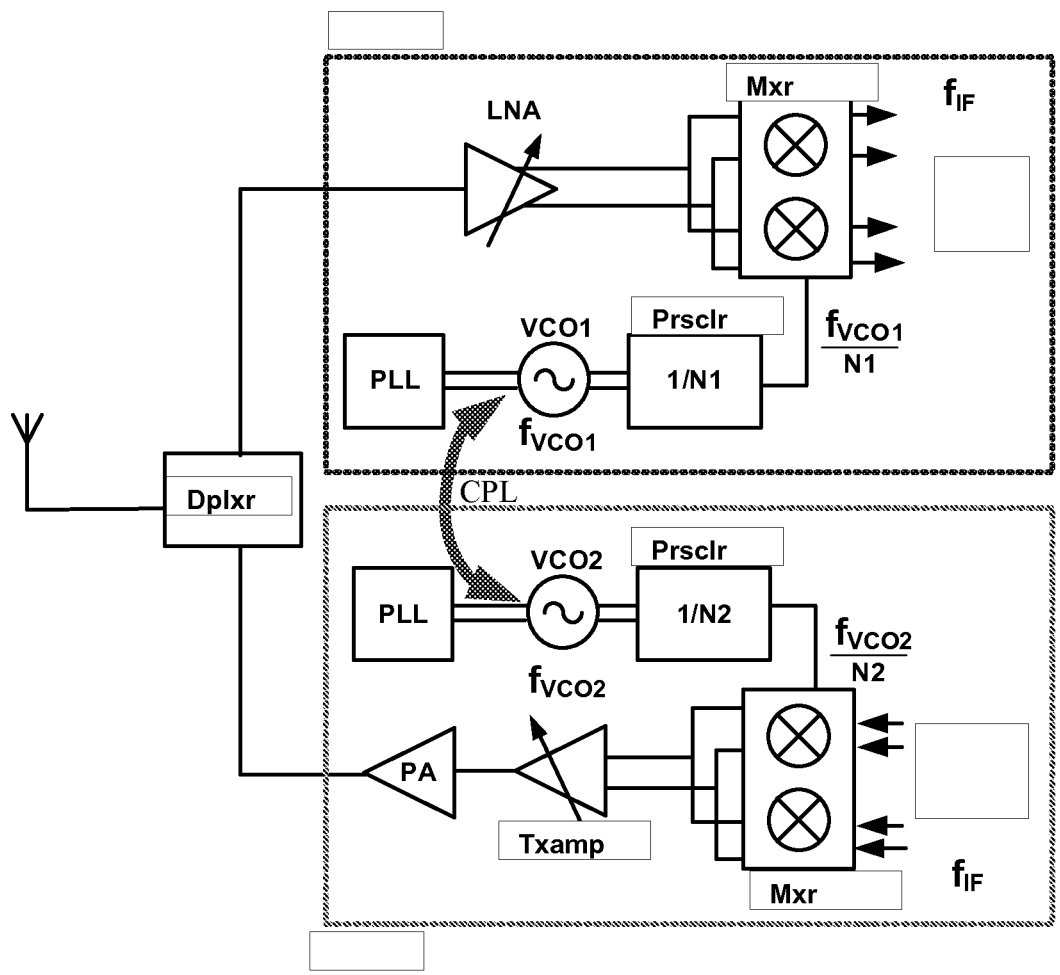
FIG. 9 illustrates oscillator pulling in a full-duplex transceiver system that may benefit from the semiconductor device in accordance with the invention.
Figure 10:
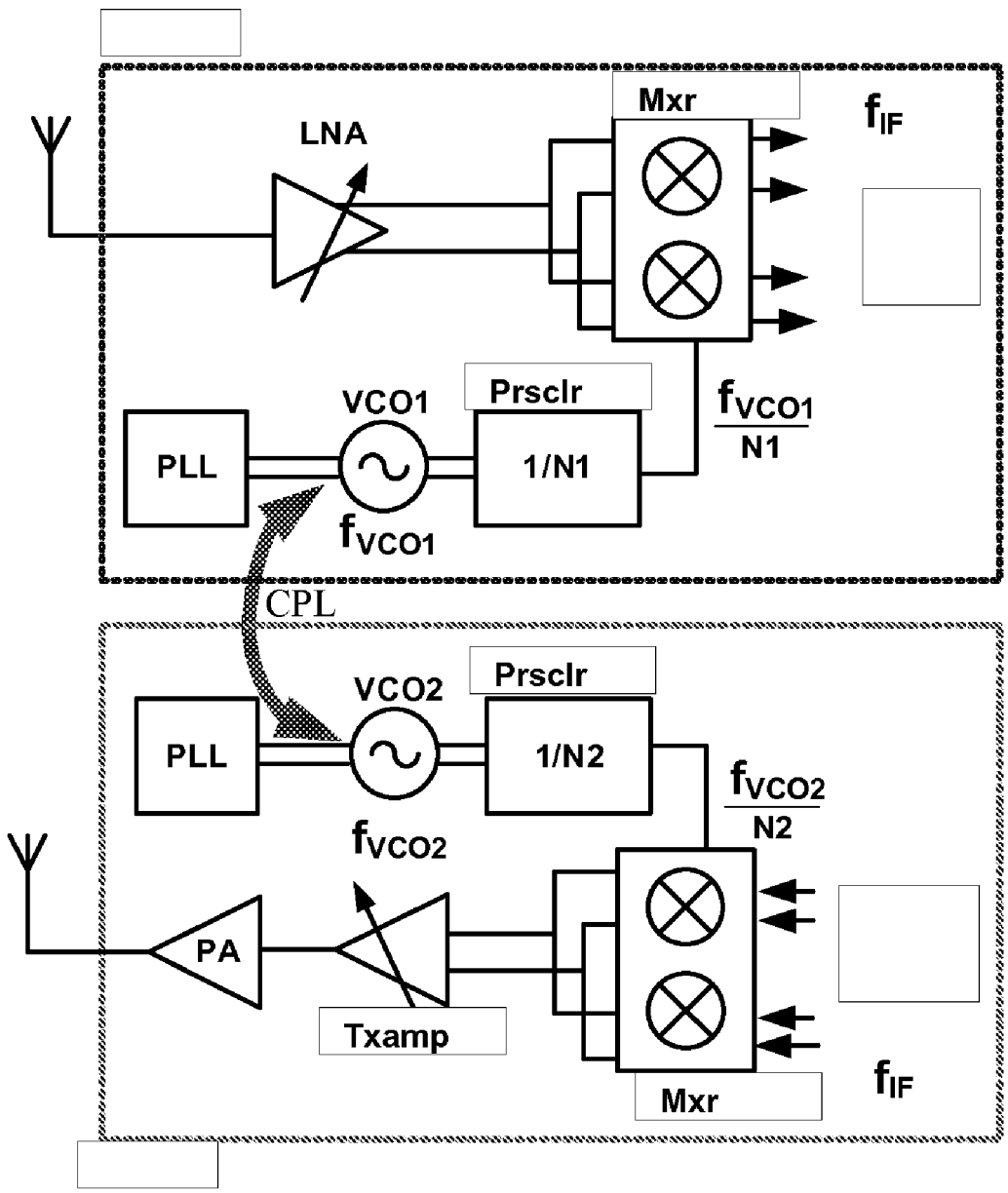
FIG. 10 illustrates oscillator pulling in a co-banding system having simultaneous reception and transmission that may benefit from the semiconductor device in accordance with the invention.

FIGS. 8 to 10 illustrate various electronic systems that may benefit from the semiconductor device comprising the inductor in accordance with the invention. FIG. 8 illustrates a broadband multi-channel TV receiver system. FIG. 9 illustrates oscillator pulling in a full-duplex transceiver system. FIG. 10 illustrates oscillator pulling in a co-banding system having simultaneous reception and transmission. All three systems are well-known to the person skilled in the art. They comprise standard building blocks like:
- low-noise amplifiers LNA, LNA1, LNA2;
- RF-filters RFfltr;
- mixers Mxr;
- prescalers Prsclr for scaling with a factor 1/N1, 1/N2;
- voltage-controlled oscillators (VCO1, VCO2) for generation of an oscillating signal at a specific frequency $f_{VCO1}$, $f_{VCO2}$;
- phase locked-loops (PLL);
- antenna's for receiving/transmitting a signal $f_{RF}$; diplexers Dplxr;
- power amplifiers PA, and
- Tx amplifiers Txamp.

The three systems comprise at least two voltage-controlled oscillators (VCO), one in each receiver/transceiver/transmitter. The voltage-controlled oscillators each comprise an inductor. The inductors are inductive coupled to each other and thus may influence each other which may result in oscillator pulling. A major advantage of using a semiconductor device comprising the inductor in accordance with the invention is that the far-field of the inductor is better reduced. A consequence of this is that the oscillator pulling is reduced, which is beneficial for the electronic system as already described. Although the advantage of the inductor in accordance with the invention is profound when used in the voltage controlled oscillator of the electronic systems of FIGS. 8-10, the inductor may also advantageously used in other parts of the systems, i.e. in the RF filter, or any one of the differential amplifiers LNA, mixer, Tx amplifier, or any load driver like the PA load driver.

In a first aspect, the invention provides to a device comprising a substrate and an electrical conductor arranged between two terminals and shaped for forming an inductor comprising at least two loops and arranged such that, at least locally, the far field is reduced. This arrangement results in an inductor which radiates a smaller magnetic field, also referred to as reduced EMI, which results in less noise generated in other inductive parts of an electronic circuit or system. The invention further provides in an advantageous embodiment proper balancing of the parasitic resistance and capacitance. By doing so the physical mid-point of 8-shaped inductors becomes the electrical mid-point which is beneficial when the inductor is used in a circuit.

In a second aspect the invention provides an electronic system comprising the device according to the invention, wherein the electronic system comprises an LC-based voltage-controlled oscillator comprising the inductor, the electronic system being one of a group comprising: a multi-channel TV-receiver, a full-duplex transceiver, and a co-banding system. All these systems benefit from the symmetrical properties of the inductor. The better far-field compensation leads to a smaller VCO pulling effect which leads to a better performance of the system.

The invention may be applied in various application areas. The invention may be applied in wireless modems and broadcast receivers that are used next to one another in a small form factor. Voltage-controlled oscillators in those modems and receivers may be hampered by oscillator pulling. The invention may also be applied in wireless modems and broadcast receivers that use an LC selective filter that may generate some gain and phase imbalance. Furthermore, the invention is applicable to wireless modems and broadcast receiver that use a differential amplifier which have either an inductive load or an inductive degeneration that may decrease IP2 performances. The invention is especially applicable to devices that are developed in the mobile and portable application area, e.g., TV FE: Mobile/Portable/terrestrial/satellite/cable/modem cable receivers
Connectivity: Bluetooth, Wireless LAN
RF Products: WiMax/Wibro
Personal: TVoM
Cellular: GSM, EDGE, UMTS.

Various variations of the device and electronic system in accordance with the invention are possible and do not depart from the scope of the invention as claimed. These variations for example relate to shape of the loops, the number of loops, the process technology in which the inductor is manufactured, the dimensions of the loops, the design of the crossings, etc. What counts in all these variations is that the inductance is balanced (far field compensation), and in some embodiments also the resistance and capacitance.

The implementation of the invention is not restricted to silicon technologies. The idea may be expanded to any other IC integration technology like GaAs or INP based technology, at the condition that the technology offers at least two interconnect layers. The invention may even be applied to PCB technology, or any other layout support.

Throughout the description the invention has been explained with reference to a device comprising an inductor. However, the special technical features that relate to the invention reside in the design and shape of the inductor. A consequence of this is that the invention is not restricted to devices. Instead, the invention is also applicable in the broader technical field of inductors. Consequently, the substrate may be a substrate of an integrated circuit or a base layer of a printed circuit board.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage. Throughout the Figures, similar or corresponding features are indicated by same reference numerals or labels.

The invention claimed is:

1. A device comprising:
   a substrate;
   a first terminal and a second terminal;
   an electrical conductor arranged on the substrate between the first terminal and the second terminal to obtain an inductor and being shaped for forming a first loop and a second loop, wherein at least a first crossing of the electrical conductor with itself is present between the first loop and the second loop, the first loop and the second loop defining a first enclosed area and a second enclosed area, respectively, and wherein the first loop and the second loop are arranged for generating magnetic fields having substantially equal strength and opposite directions to obtain a reduction of a far field generated by the inductor, wherein the electrical conductor is provided with a second crossing with itself between the terminals and the second loop for further defining the boundary of the second enclosed area.

2. Electronic system comprising the device of claim 1, the electronic system being one of a group comprising: a multi-channel TV-receiver, a full-duplex transceiver, and a co-banding system.

3. The device as claimed in claim 1, wherein the electrical conductor is further shaped for forming a third loop and a fourth loop, wherein a least a third crossing of the electrical conductor with itself is present between the third loop and the fourth loop, the third loop and the fourth loop defining a third enclosed area and a fourth enclosed area, respectively, and wherein the third loop and the fourth loop are arranged for generating magnetic fields having substantially equal strength and opposite directions to obtain, at least locally, a reduction of a far field generated by the inductor, wherein the conductor is further provided with a fourth crossing with itself connecting the first loop with the fourth loop thereby further defining the boundaries of the first enclosed area and the fourth enclosed area.

4. The device as claimed in claim 3, wherein all loops are arranged to obtain non-overlapping areas, the first loop being connected between the fourth loop and the second loop, the fourth loop being connected between the first loop and the third loop to obtain an 8-shaped structure in series with an 8-shaped structure.

5. The device as claimed in claim 4, wherein the third loop is arranged within the first loop and the fourth loop is arranged within the second loop thereby forming a fifth crossing for further defining the fourth enclosed area, and forming a sixth crossing for further defining the first and second enclosed area, to obtain an 8-within-8 shaped structure.

6. The device according to claim 1 comprising at least a first interconnect layer formed on the substrate and a second interconnect layer arranged to cooperate with the first interconnect layer, wherein the electrical conductor comprises a main part laid out in the second interconnect layer, and wherein the first crossing and second crossing each comprise a further part laid out in the first interconnect layer, the further part crossing the main part, the further part being connected to the main part by means of contacts or vias to obtain the first and second crossing of the electrical conductor wherein crossing conductor parts are electrically insulated with respect to each other by a dielectric layer in between the main part and the further part.

7. The device of claim 6, wherein the first crossing and the second crossing are constructed such that one is an pass-over structure and the other is an pass-under structure considered on a path along the conductor between the first terminal and a mid-point, the mid-point being defined on the conductor at a distance matching half the length of the conductor between the terminals.

8. The device of claim 6, wherein the crossings are constructed such that the number of pass-over structures equals the number of pass-under structures considered on a path along the conductor between the first terminal and a mid-point, the mid-point being defined on the conductor at a distance matching half the length of the conductor between the terminals.

9. The device according to claim 1, wherein the inductor is part of an electronic circuit selected from a group comprising: an RF filter, a LC-based voltage-controlled oscillator, an LC-based differential amplifier, a mixer, a Tx amplifier, and a load driver.

10. The device of claim 1, wherein the substrate is a semiconductor substrate to obtain a semiconductor device.

* * * * *